(12) United States Patent
Li et al.

(10) Patent No.: US 12,217,942 B2
(45) Date of Patent: Feb. 4, 2025

(54) PLASMA PROCESSING APPARATUS

(71) Applicant: Tokyo Electron Limited, Tokyo (JP)

(72) Inventors: Lifu Li, Miyagi (JP); Hironobu Kudo, Miyagi (JP); Hiroshi Tsujimoto, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 251 days.

(21) Appl. No.: 17/654,126

(22) Filed: Mar. 9, 2022

(65) Prior Publication Data
US 2022/0301830 A1    Sep. 22, 2022

(30) Foreign Application Priority Data

Mar. 17, 2021   (JP) .................. 2021-043840

(51) Int. Cl.
*H01J 37/32* (2006.01)
(52) U.S. Cl.
CPC .. *H01J 37/32532* (2013.01); *H01J 37/32724* (2013.01); *H01J 2237/002* (2013.01)
(58) Field of Classification Search
CPC ........... H01J 37/32724; H01J 37/32091; H01J 37/32532; H01J 2237/002
See application file for complete search history.

(56) References Cited

U.S. PATENT DOCUMENTS

2009/0102385 A1* 4/2009 Wi .................. H01J 37/32091
                                                        315/111.21
2009/0223932 A1* 9/2009 Hida ................ H01J 37/32091
                                                        156/345.37
2011/0146571 A1   6/2011 Bartlett et al.
2015/0376783 A1* 12/2015 Hanamachi ....... H01L 21/68785
                                                        118/500

FOREIGN PATENT DOCUMENTS

| JP | 2004-342704 | 12/2004 |
|---|---|---|
| JP | 2013-534695 | 9/2013 |
| JP | 2015-095551 | 5/2015 |
| JP | 2015-536043 | 12/2015 |
| JP | 2019-192728 | 10/2019 |
| WO | 2011/156239 | 12/2011 |
| WO | 2014/052301 | 4/2014 |

\* cited by examiner

*Primary Examiner* — Joseph A Miller, Jr.
(74) *Attorney, Agent, or Firm* — IPUSA, PLLC

(57) ABSTRACT

A plasma processing apparatus includes a chamber, a substrate support including a bottom electrode, and a top electrode assembly disposed above the substrate support. The top electrode assembly includes a top electrode plate and a thermally conductive plate disposed above the top electrode plate. The top electrode assembly includes a coolant flow path disposed within the thermally conductive plate. The top electrode assembly includes at least one heating element thermally connected to the thermally conductive plate, the heating element being disposed at a location that does not overlap the coolant flow path in a height direction of the plasma processing apparatus. The plasma processing apparatus includes a controller that controls at least one among a coolant flowing through the coolant flow path and the heating element, based on a temperature of the top electrode plate detected by a temperature sensor, to adjust the temperature of the top electrode plate.

6 Claims, 6 Drawing Sheets

PLASMA PROCESSING APPARATUS

CROSS-REFERENCE TO RELATED APPLICATIONS

This patent application claims priority to Japanese Patent Application No. 2021-043840, filed Mar. 17, 2021, the contents of which are incorporated herein by reference in their entirety.

TECHNICAL FIELD

The present disclosure relates to a plasma processing apparatus.

BACKGROUND

For example, Japanese Patent 1 discloses a method for controlling a temperature, and in the method, a top electrode of a capacitively coupled plasma processing apparatus is cooled, and the temperature of the top electrode can be increased in a short time.

RELATED-ART DOCUMENT

[Patent Document]
[Patent Document 1] Japanese Unexamined Patent Application Publication No. 2019-192728

SUMMARY

According to one aspect of the present disclosure, a plasma processing apparatus is provided. The plasma processing apparatus includes a chamber and a substrate support disposed in the chamber, the substrate support including a bottom electrode. The plasma processing apparatus includes a top electrode assembly disposed above the substrate support. The top electrode assembly includes a top electrode plate disposed such that a plasma process space is formed between the top electrode plate and the substrate support. The top electrode assembly includes a thermally conductive plate disposed above the top electrode plate, the thermally conductive plate being thermally connected to the top electrode plate. The top electrode assembly includes a coolant flow path disposed within the thermally conductive plate. The top electrode assembly includes at least one heating element thermally connected to the thermally conductive plate, the at least one heating element being disposed at a location that does not overlap the coolant flow path in a height direction of the plasma processing apparatus. The plasma processing apparatus includes a temperature sensor configured to detect a temperature of the top electrode plate. The plasma processing apparatus includes a controller configured to control at least one among a coolant flowing through the coolant flow path and the heating element, based on the temperature detected by the temperature sensor, to adjust the temperature of the top electrode plate.

DETAILED DESCRIPTION

<Plasma Processing System>

Figure 1:
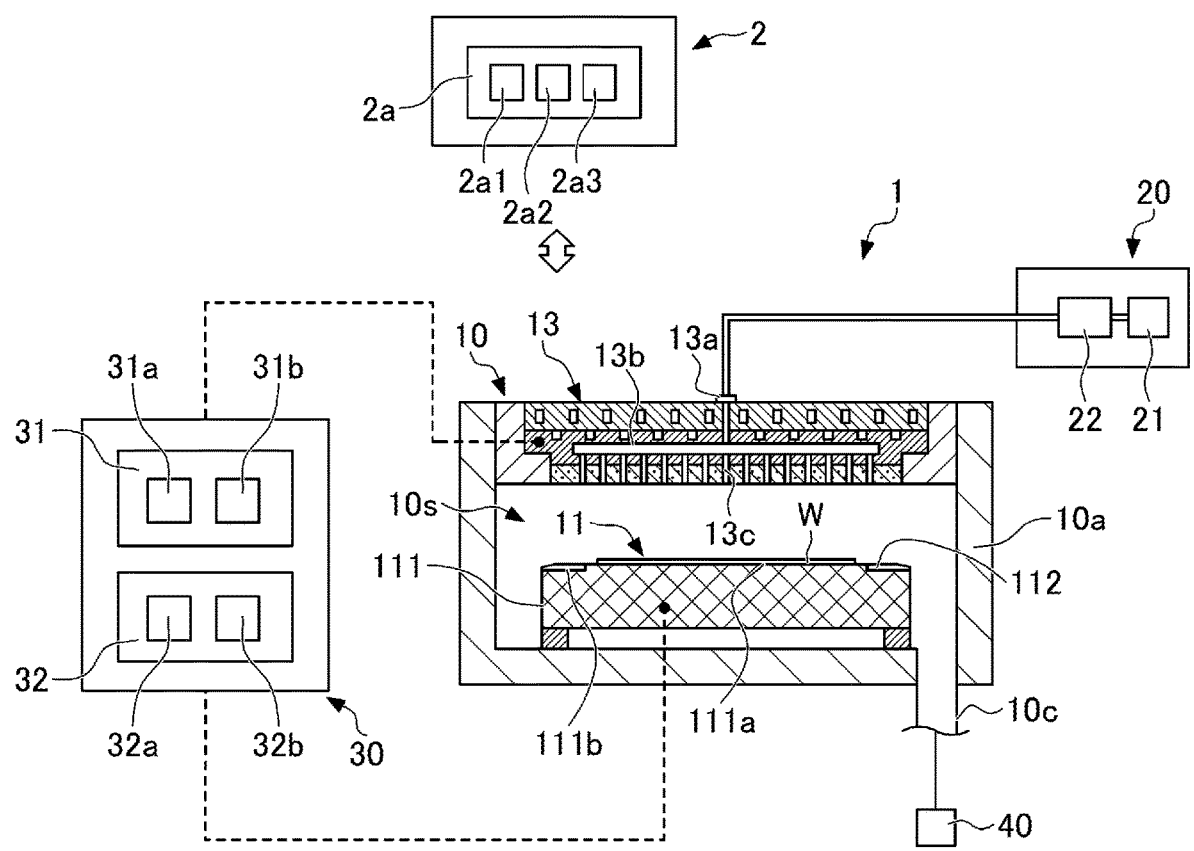
FIG. 1 is a diagram illustrating an example of the configuration of a plasma processing system according to the present embodiment.

An example of the configuration of a plasma processing system will be described below.

The plasma processing system includes a capacitively coupled plasma processing apparatus 1 and a controller 2. The capacitively coupled plasma processing apparatus 1 includes a plasma processing chamber 10, a gas supply 20, a power source 30, and an exhausting system 40. The plasma processing apparatus 1 also includes a substrate support 11 and a gas introduction unit. The gas introduction unit is configured to introduce at least one process gas into the plasma processing chamber 10. The gas introduction unit includes a showerhead 13. The substrate support 11 is disposed in the plasma processing chamber 10. The showerhead 13 is disposed above the substrate support 11. In one embodiment, the showerhead 13 forms at least a portion of the ceiling of the plasma processing chamber 10. The plasma processing chamber 10 has a plasma process space 10s defined by (i) the showerhead 13, (ii) a sidewall 10a of the plasma processing chamber 10, and (iii) the substrate support 11. The plasma processing chamber 10 includes at least one gas supply gate via which at least one process gas is supplied to the plasma process space 10s, and includes at least one gas outlet via which the gas is exhausted from the plasma process space. The sidewall 10a is grounded. The showerhead 13 and substrate support 11 are electrically isolated from a housing of the plasma processing chamber 10.

The substrate support 11 includes a main body 111 and a ring assembly 112. The main body 111 has a central region (substrate-supporting surface) 111a on which a substrate (wafer) W is supported and has an annular region (ring-supporting surface) 111b on which a ring assembly 112 is supported. The annular region 111b of the main body 111 surrounds the central region 111a of the main body 111 in a plan view. The substrate W is disposed on the central region 111a of the main body 111, and the ring assembly 112 is disposed on the annular region 111b of the main body 111 so as to surround the substrate W on the central region 111a of the main body 111. In one embodiment, the main body 111 includes a base and an electrostatic chuck. The base includes an electrically conductive member. The electrically conductive member of the base serves as a bottom electrode. The electrostatic chuck is disposed on the base. A top surface of the electrostatic chuck has the substrate-supporting surface 111a. The ring assembly 112 includes one or more annular members. The one or more annular members include an edge ring. Although not illustrated, the substrate support 11 may include a temperature control module configured to adjust the temperature of at least one of the substrate, the electrostatic chuck, and the ring assembly 112, to a target temperature. The temperature control module may include a heater, a heat medium, a flow path, or a combination thereof. A heat transfer fluid, such as brine or gas, flows through a flow path. The substrate support 11 may also include a heat transfer gas supply configured to supply the heat transfer gas between a back surface of the substrate W and the substrate-supporting surface 111a.

The showerhead 13 is configured to introduce at least one process gas from the gas supply 20 into the plasma process space 10s. The showerhead 13 has at least one gas supply port 13a, at least one gas diffusion compartment (gas diffusion space) 13b, and a plurality of gas inlets 13c. A process gas supplied to the gas supply port 13a passes through the gas diffusion compartment 13b and then is introduced into the plasma process space 10s through a plurality of gas inlets 13c. The showerhead 13 also includes an electrically conductive member. The electrically conductive member of the showerhead 13 serves as a top electrode. In addition to the showerhead 13, the gas introduction unit may include one or more side gas injectors (SGIs) that are respectively attached to one or more openings formed in the sidewall 10a. The showerhead 13 will be described below in detail.

The gas supply 20 may include at least one gas source 21 and at least one flow controller 22. In one embodiment, the gas supply 20 is configured to supply at least one process gas from a corresponding gas source 21 to the showerhead 13, via a corresponding flow controller 22. Each flow controller 22 may include, for example, a mass flow controller or a pressure-regulated flow controller. Further, the gas supply 20 may include one or more flow modulating devices each of which modulates or pulses a flow rate of at least one process gas.

The power source 30 includes a radio frequency (RF) power source 31 coupled to the plasma processing chamber 10 via at least one impedance matching circuit. The RF power source 31 is configured to supply at least one RF signal (RF power), such as a source RF signal or a bias RF signal, to at least one of an electrically conductive member of the substrate support 11 and an electrically conductive member of the showerhead 13. With this arrangement, a plasma is formed from at least one process gas supplied to the plasma process space 10s. Therefore, the RF power source 31 may serve as at least a portion of a plasma generator configured to generate the plasma from one or more process gases in the plasma processing chamber 10. Also, when the bias RF signal is supplied to the electrically conductive member of the substrate support 11, a bias potential is generated at the substrate W, and an ion component in the formed plasma can be drawn into the substrate W.

In one embodiment, the RF power source 31 includes a first RF generator 31a and a second RF generator 31b. The first RF generator 31a is coupled to at least one of the electrically conductive member (bottom electrode) of the substrate support 11 and the electrically conductive member (top electrode plate 131 described below) of the showerhead 13, via at least one impedance matching circuit. The first RF generator 31a is configured to generate a source RF signal (source RF power) for plasma generation. In one embodiment, the first RF generator 31a is configured to generate first source RF power during a first period and to generate second source RF power, which is less than the first source RF power, during a second period that is different from the first period. The first RF generator 31a is also configured to generate third source RF power during a third period that is different from the first period and the second period, and the third RF power is less than the first source RF power and greater than the second source RF power. In one embodiment, the source RF signal is set at a frequency in the range of from 13 MHz through 150 MHz. In one embodiment, the first RF generator 31a may be configured to generate a plurality of source RF signals each of which is set at a different frequency. The generated one or more source RF signals are supplied to at least one of an electrically conductive member of the substrate support 11 and the electrically conductive member of the showerhead 13. The second RF generator 31b is coupled to the electrically conductive member of the substrate support 11 via at least one impedance matching circuit and is configured to generate a bias RF signal (bias RF power). In one embodiment, the bias RF signal is set at a frequency that is lower than that of the source RF signal. In one embodiment, the bias RF signal is set at a frequency in the range of from 400 kHz through 13.56 MHz. In one embodiment, the second RF generator 31b may be configured to generate a plurality of bias RF signals each of which is set at a different frequency. The generated one or more bias RF signal or signals are supplied to the electrically conductive member of the substrate support 11. In various embodiments, at least one of the source RF signal and the bias RF signal may be pulsed.

The power source 30 may include a DC power source 32 coupled to the plasma processing chamber 10. The DC power source 32 includes a first DC generator 32a and a second DC generator 32b. In one embodiment, the first DC generator 32a is connected to the electrically conductive member of the substrate support 11 and is configured to generate a first DC signal. The generated first bias DC signal is applied to the electrically conductive member of the substrate support 11. In one embodiment, the first DC signal may be applied to another electrode such as an electrode in an electrostatic chuck. In one embodiment, the second DC generator 32b is connected to the electrically conductive member of the showerhead 13 and is configured to generate a second DC signal. The generated second DC signal is applied to the electrically conductive member of the showerhead 13. In various embodiments, at least one of the first DC signal and the second DC signal may be pulsed. The first DC generator 32a and the second DC generator 32b may be provided in addition to the RF power source 31, and the first DC generator 32a may be provided instead of the second RF generator 31b.

The exhausting system 40 may be connected to, for example, a gas outlet (not illustrated) provided at the bottom of the plasma processing chamber 10. The exhausting system 40 may include a pressure control valve and a vacuum pump. The pressure control valve controls pressure of the plasma process space 10s. The vacuum pump may include a turbomolecular pump, a dry pump, or a combination thereof.

The controller 2 executes computer-executable instructions that cause the plasma processing apparatus 1 to perform various steps described in the present disclosure. The controller 2 may be configured to control each component of the plasma processing apparatus 1 so as to perform the various steps described in this description. In one embodiment, a portion or all of the controller 2 may be included in the plasma processor 1. The controller 2 may include, for example, a computer 2a. The computer 2a may include, for example, a processing unit (central processing unit: CPU) 2a1, a storage 2a2, and a communication interface 2a3. The processing unit 2a1 may be configured to perform various control operations based on a program stored in the storage 2a2. The storage 2a2 may include a random access memory (RAM), a read only memory (ROM), a hard disk drive (HDD), a solid state drive (SSD), or a combination thereof. The communication interface 2a3 may communicate with the plasma processing apparatus 1 through a communication line such as a local area network (LAN).

[Plasma Processing Chamber 10]

Figure 2:
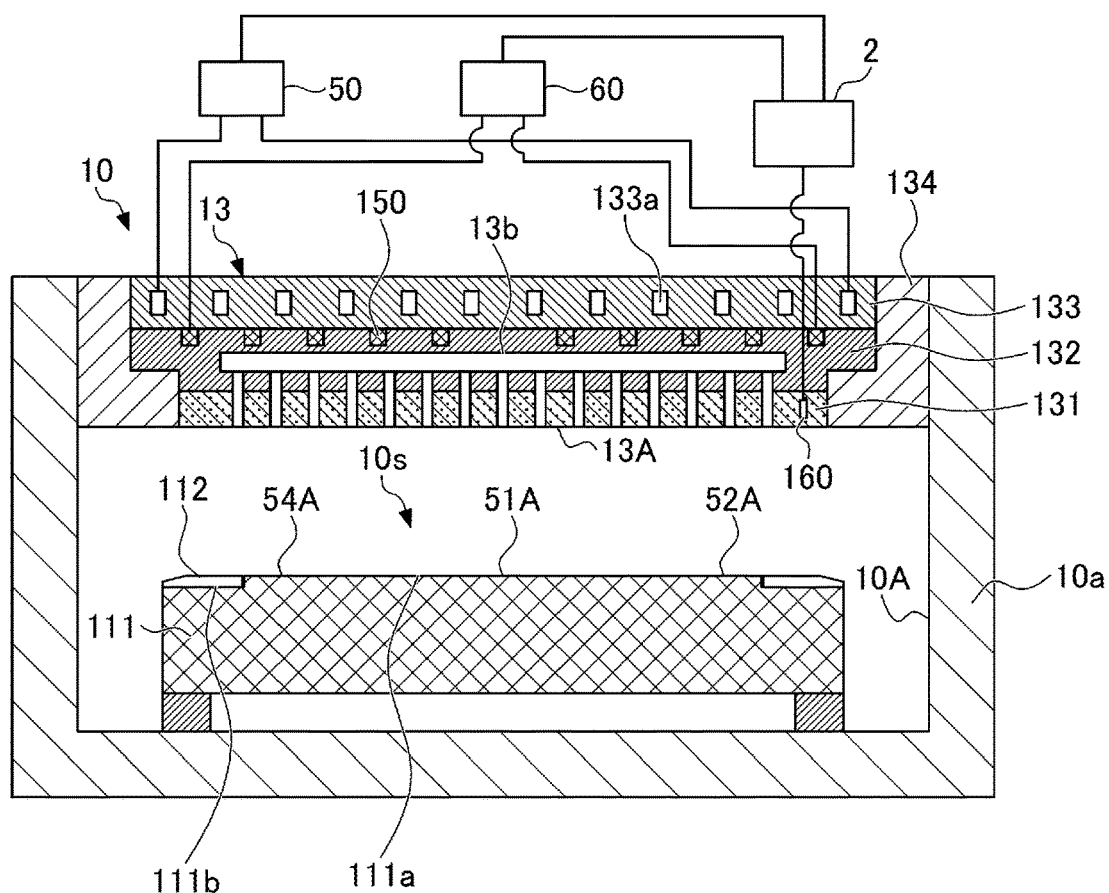
FIG. 2 is a cross-sectional view of an example of the schematic configuration of a plasma processing chamber of the plasma processing system according to the present embodiment.

The plasma processing chamber 10 of the plasma processing apparatus 1 according to the present embodiment will be described below in detail. FIG. 2 is a cross-sectional view of an example of the schematic configuration of the plasma processing chamber 10 of the plasma processing apparatus 1 according to the present embodiment.

The showerhead (top electrode assembly) 13 of the plasma processing chamber 10 according to the present embodiment includes a top electrode plate 131, a gas diffusion plate 132, and a thermally conductive plate 133. In one embodiment, the plasma processing apparatus 1 includes the plasma processing chamber 10, the substrate support 11, and the top electrode assembly 13. The substrate support 11 is disposed in the plasma processing chamber 10 and includes a bottom electrode. The top electrode assembly 13 is disposed above the substrate support 11. The top electrode assembly 13 includes the top electrode plate 131, the thermally conductive plate 133, and the gas diffusion plate 132. The plasma process space is formed between the top electrode plate 131 and the substrate support 11. The thermally conductive plate 133 is disposed above the top electrode plate 131 and is thermally connected to the top electrode plate 131. The gas diffusion plate 132 has the gas diffusion space 13b and is disposed between the top electrode plate 131 and the thermally conductive plate 133.

A bottom surface of the top electrode plate 131 is exposed to the plasma process space 10s. The top electrode plate 131 contacts a plasma in the plasma process space 10s. A surface of the top electrode plate 131 on a side of the plasma process space 10s is a ceiling surface 13A. When the plasma is formed in the plasma process space 10s, heat of the formed plasma is transferred to the top electrode plate 131. The heat entering the top electrode plate 131 is transferred to the gas diffusion plate 132. The top electrode plate 131 is formed of, for example, silicon or quartz.

The gas diffusion plate 132 is provided on an upper side of the top electrode plate 131. The gas diffusion plate 132 contacts the top electrode plate 131. The gas diffusion plate 132 transfers heat from the plasma process space 10s, through the top electrode plate 131, to the thermally conductive plate 133. The gas diffusion plate 132 includes the gas diffusion compartment 13b. The gas diffusion plate 132 is formed of a metal, such as aluminum, or alloy.

The thermally conductive plate 133 cools (draws heat) the top electrode plate 131 through the gas diffusion plate 132, by absorbing heat that is transferred from the plasma process space 10s through the top electrode plate 131 and the gas diffusion plate 132. The thermally conductive plate 133 is provided on an upper side of the gas diffusion plate 132. The thermally conductive plate 133 contacts the gas diffusion plate 132. The thermally conductive plate 133 is formed of a metal, such as aluminum, or alloy. The thermally conductive plate 133 may be formed of a different material from the gas diffusion plate 132, or may be formed of the same material as the gas diffusion plate 132. In the latter case, the thermally conductive plate 133 may be formed integrally with the gas diffusion plate 132. The thermally conductive plate 133 may be also formed integrally by being joined with the gas diffusion plate 132. One or more coolant flow paths 133a are provided in an interior of the thermally conductive plate 133. Each coolant flow path 133a includes a coolant inlet and a coolant outlet. The coolant flows into the thermally conductive plate 133 through the coolant inlet of the coolant flow path 133a, flows through the coolant flow path 133a, and then flows out through the coolant outlet of the coolant flow path 133a. The heat that is transferred from the top electrode plate 131 to the thermally conductive plate 133, via the gas diffusion plate 132, is heat exchanged with the coolant flowing through the coolant flow path 133a.

The coolant inlet and the coolant outlet are each connected to the coolant temperature controller 50. The coolant temperature controller 50 controls the temperature of the coolant to a temperature set by the controller 2.

The thermally conductive plate 133 may include, for example, one coolant flow path 133a, or may include a plurality of coolant flow paths 133a. When the plurality of coolant flow paths 133a are provided, each of the plurality of coolant flow paths 133a includes a coolant inlet and a coolant outlet. With this arrangement, the top electrode assembly 13 includes one or more coolant flow paths 133a that are disposed inside the thermally conductive plate 133.

The showerhead 13 includes at least one heating element 150 between the gas diffusion plate 132 and the thermally conductive plate 133. The at least one heating element 150 is disposed lower than the coolant flow path 133a. In one embodiment, the at least one heating element 150 extends from the bottom surface of the thermally conductive plate 133, into the interior of the gas diffusion plate 132. In one embodiment, the at least one heating element 150 is disposed within the gas diffusion plate 132 and is physically in contact with the bottom surface of the thermally conductive plate 133. Each heating element 150 is provided at an interface between the gas diffusion plate 132 and the thermally conductive plate 133. The heating element 150 is a flexible heater. In one embodiment, the heating element 150 may be a sheathed heater. The cross-sectional shape of the heater is rectangular (flexible square heater). In one embodiment, the cross-sectional shape of the heater may be a circle, an ellipse, a star, or the like. Each heating element 150 is connected to a heating drive 60. The controller 2 controls the heating drive 60 to adjust power (current) to be supplied to each heating element 150. By adjusting the power supplied to each heating element 150, the temperature of the heating element 150 is controlled.

Each heating element 150 is provided such that there is no overlap with a corresponding coolant flow path 133a, when viewed from above the coolant flow path. For example, each heating element 150 is provided at a middle portion between adjacent coolant flow paths 133a, when viewed from above the coolant flow paths. Each heating element 150 is disposed at a location that does not overlap the coolant flow path 133a, when viewed from above the coolant flow path. With this arrangement, a cooling passage and a heating passage for the top electrode plate 131 are secured so as not to interfere with each other.

Each heating element 150 may be formed of a sheet or plate in which one or more heating wires are embedded. In this case, the sheet or plate is not formed at a portion that overlaps the coolant flow path 133a in a plan view. In other words, the sheet or plate in which one or more heating wires are embedded has one or more openings, each of which overlap a given coolant flow path 133a in a plan view. When the heating element 150 is formed with a plurality of electric heating wires, each of the plurality of heating wires is connected to the heating drive 60. With this arrangement, the top electrode assembly 13 includes at least one heating element 150. The heating element 150 is thermally connected to the thermally conductive plate 133 and is disposed at a location that does not overlap the coolant flow path 133a, when viewed vertically. In one embodiment, the top electrode assembly 13 may include a plurality of heating elements 150.

A temperature sensor 160 is provided in the top electrode plate 131. The temperature sensor 160 is connected to the controller 2. The controller 2 controls the temperature of the top electrode plate 131 based on the temperature measured by the temperature sensor 160, such that the controlled temperature is maintained at a set temperature. In one embodiment, the plasma processing apparatus 1 includes the temperature sensor 160 configured to detect the temperature of the top electrode plate 131.

The controller 2 causes the plasma to be formed based on RF power that the RF power source 31 supplies. When the plasma is formed, a large amount of heat that is obtained through the plasma is transferred to the showerhead 13. The heat from the plasma causes the temperature of the showerhead 13 to increase. For example, when the RF power source 31 supplies first RF power, the controller 2 controls the temperature of the coolant through the coolant temperature controller 50, stops the control of one or more heating elements 150 through the heating drive 60, and thus may cool the showerhead 13 to adjust the temperature of the top electrode plate 131. With this arrangement, during the first period described above, the controller 2 is configured to cool the top electrode plate 131 by controlling the coolant flowing through one or more coolant flow paths 133a and by stopping the control of each heating element 150. The coolant flowing through the coolant flow path 133a may be controlled by varying a flow rate of the coolant, or may be controlled by varying a coolant temperature. The coolant may be also controlled by varying both the flow rate and the temperature for the coolant. The temperature of each heating element 150 is controlled by varying the current flowing through the heating element 150. The control of each heating element 150 is stopped by reducing the current flowing through the heating element 150 to zero or near zero. In one embodiment, the controller 2 is configured to control at least one of (i) the coolant flowing through the coolant flow path 133a and (ii) the heating element 150, based on the temperature detected by the temperature sensor 160, to thereby adjust the temperature of the top electrode plate 131. In one embodiment, the controller 2 is configured to control at least one of (i) the coolant flowing through the coolant flow path 133a and (ii) the heating element 150, in order to maintain the temperature of the top electrode plate 131 at a set temperature. When the top electrode assembly 13 includes a plurality of coolant flow paths 133a, at least one of a temperature and a flow rate for the coolant flowing through all of the coolant flow paths 133a may be controlled. Alternatively, at least one of a temperature and a flow rate for the coolant flowing through a portion of the plurality of coolant flow paths 133a may be controlled. When the top electrode assembly 13 includes a plurality of heating elements 150, all of the heating elements 150 may be controlled. Alternatively, a portion of the plurality of heating elements 150 may be controlled.

Further, when RF power supplied from the RF power source 31 is reduced, or when the plasma is not formed, the controller 2 causes the temperature of the showerhead 13 to be reduced. For example, when the RF power source 31 supplies second RF power that is less than first RF power, the controller 2 controls the temperature of one or more heating elements 150 by stopping the control of the coolant temperature controller 50, and then may adjust the temperature of the top electrode plate 131 by heating the showerhead 13 through the heating drive 60. With this arrangement, during the second period described above, in order to maintain the temperature of the top electrode plate 131 at a set temperature, the controller 2 is configured to heat the top electrode plate 131 by stopping the control of the coolant flowing through one or more coolant flow paths 133a and by controlling one or more heating elements 150. The control of the coolant may be stopped by reducing a flow rate of the coolant flowing through one or more coolant flow paths 133a, to zero or near zero. Alternatively, the control of the coolant may be stopped by causing the coolant, of which the temperature or the flow rate is not adjusted in the aforementioned temperature control of the top electrode plate 131, to flow into one or more coolant flow paths 133a. For example, when the control of the coolant is stopped, the controller 2 also controls the coolant such that a flow rate of the coolant is minimized in order to minimize an amount of heat that is absorbed by the coolant and is transferred from one or more heating elements 150. That is, efficiency in heating the top electrode plate 131 can be increased.

Further, for example, when the RF power source 31 supplies third RF power that is less than the first RF power and greater than the second RF power, the controller 2 may cause the coolant temperature controller 50 to control the temperature of the coolant, while causing the heating drive 60 to control the temperature of one or more heating elements 150. In such a manner, cooling and heating of the showerhead 13 may be performed simultaneously to thereby adjust the temperature of the top electrode plate 131. With this arrangement, during the third period described above, the controller 2 is configured to maintain the temperature of the top electrode plate 131 at a set temperature by controlling both the coolant flowing through one or more coolant flow paths 133a and one or more heating elements 150.

The RF power source 31 is an example of an RF power source, and the showerhead 13 is an example of a top electrode assembly.

The effect of the showerhead 13 according to the present embodiment will be described. In consideration of one or more heating elements 150, the thermally conductive plate 133, and the positional relation among them, influence of the temperature will be described.

Figure 3:
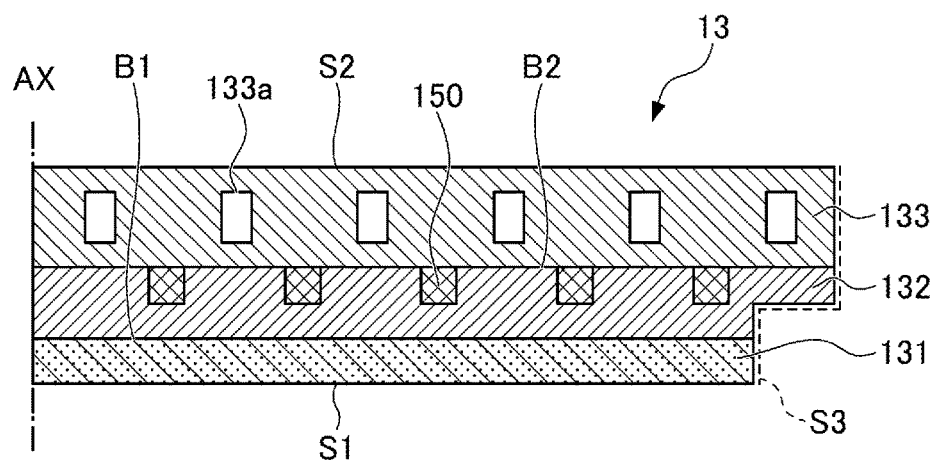
FIG. 3 is a cross-sectional view of an analysis model of a showerhead of the plasma processing system according to the present embodiment.

FIG. 3 is a cross-sectional view of the showerhead 13 according to the present embodiment, and the cross-sectional view is described for an analysis model of the showerhead 13. The showerhead 13 includes heating elements 150 in the gas diffusion plate 132 on a side of the thermally conductive plate 133. The analysis model of the showerhead 13 is rotation symmetrical about an axis AX.

In the analysis, the top electrode plate 131 is made of silicon, the gas diffusion plate 132 and the thermally conductive plate 133 are made of aluminum, and each heating element 150 is made of a stainless steel. When the plasma is not formed, heat is considered not to be transferred to a surface S1 of the top electrode plate 131. When the plasma is formed, heat of 15 kW is considered to be transferred to the surface S1 of the top electrode plate 131. When the temperature of the atmosphere is 25° C., a heat transfer coefficient for an interface between a surface S2 of the thermally conductive plate 133, which is in contact with the atmosphere, and the atmosphere, is 10 W/(m²·K). A surface S3 of the thermally conductive plate 133 is a heat insulating surface.

Thermal resistance for each of (i) an interface B1 between the top electrode plate 131 and the gas diffusion plate 132 and (ii) an interface B2 between the gas diffusion plate 132 and the thermally conductive plate 133 is 0.0008 K·m²/W.

Further, in order to simulate cooling by the thermally conductive plate 133, the temperature of the coolant flowing through each coolant flow path 133a is set to 35° C., and a heat transfer coefficient of the thermally conductive plate is varied to be in the range of from 100 through 600 W/(m²·K).

In order to simulate heating by the heating elements 150, each heating element 150 generates heat in the range of from 1 W through 2500 W.

Figure 7:
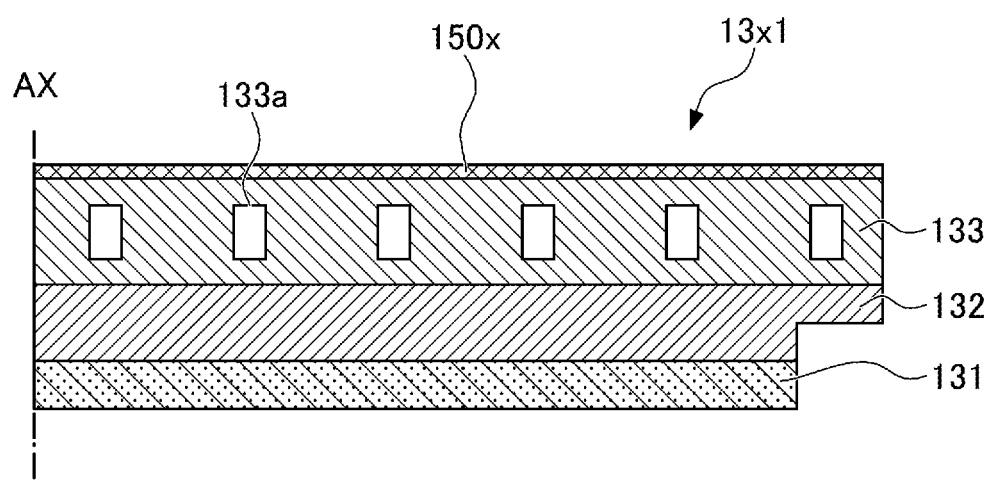
FIG. 7 is a cross-sectional view of an example of the configuration of the showerhead in a first reference example.
Figure 8:
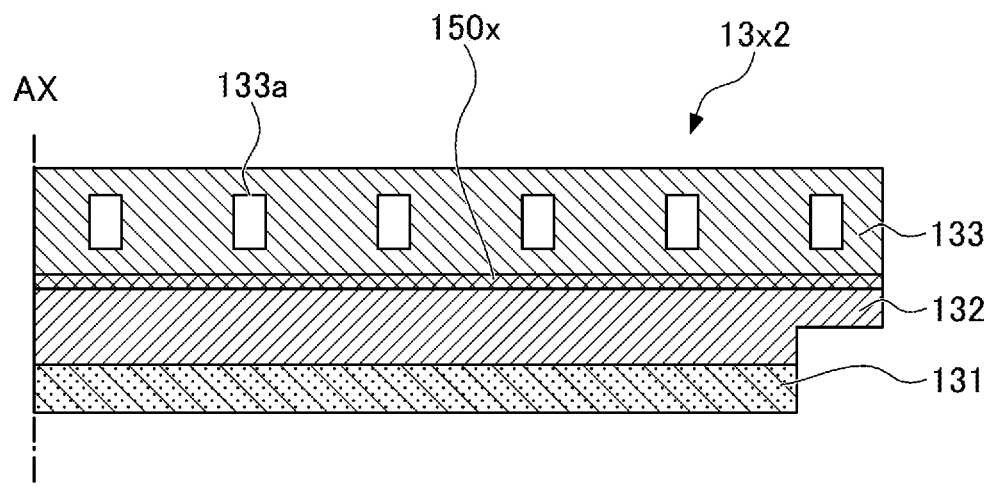
FIG. 8 is a cross-sectional view illustrating an example of the configuration of the showerhead in a second reference example.

Each reference example to be compared with the analysis model of the showerhead 13 will be described below. FIG. 7 is a cross-sectional view of a showerhead 13x1 in a first reference example, and the cross-sectional view is described for an analysis model of the showerhead 13x1. FIG. 8 is a cross-sectional view of a showerhead 13x2 in a second reference example, and the cross-sectional view is described for an analysis model of the showerhead 13x2. The showerhead 13x1 in the first reference example includes a heating sheet 150x on the entire top surface of the thermally conductive plate 133. The showerhead 13x2 in the second reference example includes the heating sheet 150x on the entire surface of the thermally conductive plate 133 on a side of the gas diffusion plate 132.

Heating and cooling performance of the showerhead 13, as well as heating and cooling performance of each of the showerhead 13x1 and the showerhead 13x2, will be described.

Hereafter, a case in which the heating sheet 150x is provided on any one of surfaces of the thermally conductive plate 133 will be described.

Figure 9:
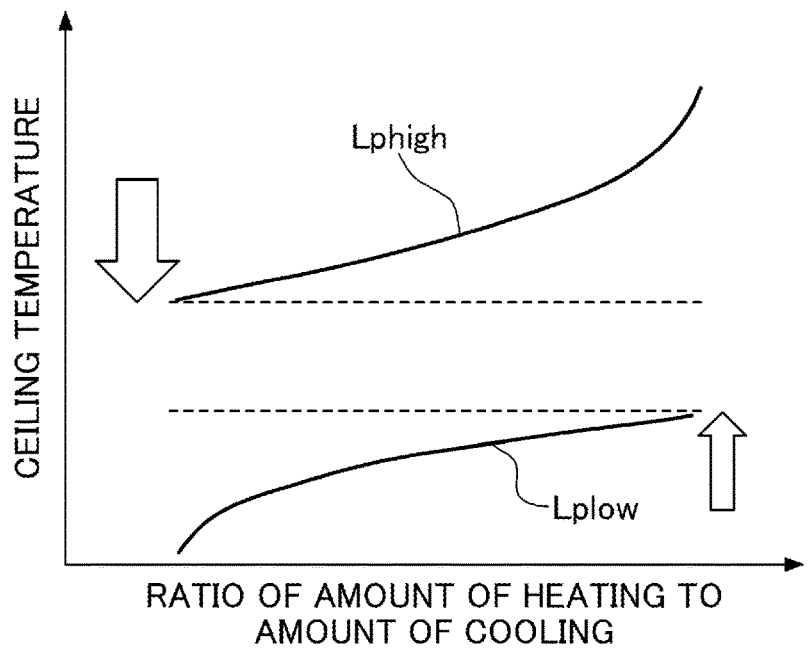
FIG. 9 is a diagram for describing a temperature characteristic of the showerhead in the first reference example.

FIG. 9 is a diagram for qualitatively describing the heating and cooling performance of the showerhead 13x1 in the first reference example. The vertical axis expresses the temperature of the top electrode plate 131. The horizontal axis expresses a ratio of an amount of heating by the heating sheet 150x to an amount of cooling by the thermally conductive plate 133 (ratio given by a heating amount/a cooling amount). In the horizontal axis, a greater ratio of the amount of cooling to the amount of heating is obtained toward the left, and a greater ratio of the amount of heating to the amount of cooling is obtained toward the right.

A curve Lphigh indicates the temperature of the top electrode plate 131 when RF power supplied from the RF power source 31 is increased. A curve Lplow indicates the temperature of the top electrode plate 131 when RF power supplied from the RF power source 31 is decreased.

The showerhead 13x1 includes the top electrode plate 131, the gas diffusion plate 132, the thermally conductive plate 133, and the heating sheet 150x that are sequentially arranged from the bottom of the showerhead. The heating sheet 150x incorporates one or more heating wires. As illustrated in FIG. 9, in the showerhead 13x1, a relatively wide range (range of uncontrollable temperatures) between a lower limit of a temperature-controlled range that is determined with respect to the curve Lphigh and an upper limit of a temperature-controlled range that is determined with respect to the curve Lplow is obtained. This is because heat from the heating sheet 150x is absorbed by the coolant within one or more thermally conductive plates 133. That is, in the showerhead 13x1 in the first reference example, thermal transfer from the heating sheet 150x to the top electrode plate 131 is prevented by the coolant within the thermally conductive plate 133. With this arrangement, it is difficult to increase the upper limit of the temperature-controlled range determined with respect to the curve Lplow.

Figure 10:
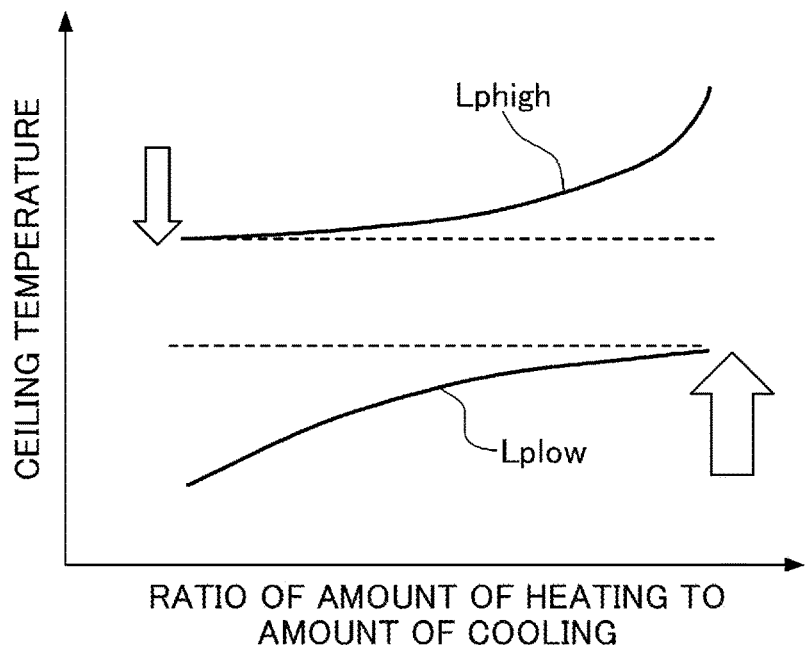
FIG. 10 is a diagram for describing the temperature characteristic of the showerhead in the second reference example.

FIG. 10 is a diagram for qualitatively describing the heating and cooling performance of the showerhead 13x2 in the second reference example. The definitions and the like are used as in FIG. 9.

The showerhead 13x2 includes the top electrode plate 131, the gas diffusion plate 132, the heating sheet 150x, and the thermally conductive plate 133 that are sequentially arranged from the bottom of the showerhead. As illustrated in FIG. 10, in the showerhead 13x2, a relatively wide range (range of uncontrollable temperatures) between a lower limit of a temperature-controlled range determined with respect to the curve Lphigh and an upper limit of a temperature-controlled range determined with respect to the curve Lplow is obtained. This is because the heating sheet 150x is used as resistance of a heat transfer path that extends from the top electrode plate 131 to the thermally conductive plate 133. In other words, in the showerhead 13x2 in the second reference example, thermal transfer from the top electrode plate 131 to the coolant within the thermally conductive plate 133 is prevented by the heating sheet 150x. With this arrangement, it is difficult to reduce the lower limit of the temperature-controlled range determined with respect to the curve Lphigh.

Figure 11:
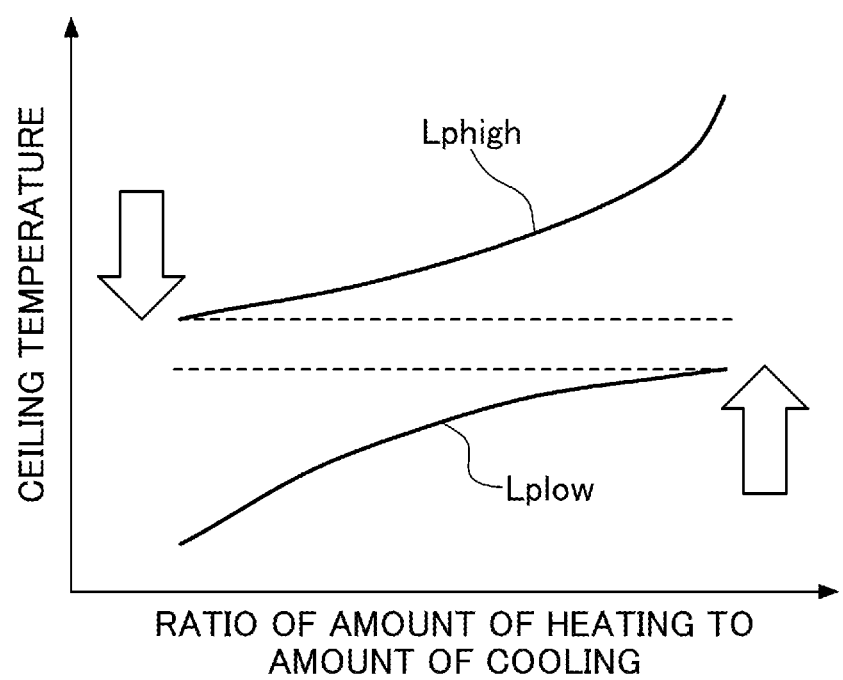
FIG. 11 is a diagram for describing an example of the temperature characteristic of the showerhead of the plasma processing system according to the present embodiment.

FIG. 11 is a diagram for qualitatively describing the heating and cooling performance of the showerhead 13 according to the present embodiment. The definitions and the like are used as in FIG. 9. In the showerhead 13 according to the present embodiment, each heating element 150 is disposed such that there is no overlap with the coolant flow paths 133a, when viewed from above the coolant flow paths. As illustrated in FIG. 11, in the showerhead 13, a narrow range (range of uncontrollable temperatures) between a lower limit of the temperature-controlled range determined with respect to the curve Lphigh and an upper limit of the temperature-controlled range determined with respect to the curve Lplow is obtained in comparison to a case in which the showerheads 13x1 and 13x2 in the reference examples are used. This is because both a heat transfer path, which extends from the at least one heating element 150 to the top electrode plate 131, and a heat transfer path that extends from the top electrode plate 131 to the coolant within the thermally conductive plate 133 are secured. With this arrangement, thermal resistance of the heat transfer paths can be minimized. Accordingly, in the showerhead 13 according to the present embodiment, a small range of uncontrollable temperatures is obtained in comparison to the case in which the showerheads 13x1 and 13x2 in the reference examples are used. Thus, improved temperature control of the top electrode plate 131 is performed. Such a trend is indicated by the result of simulation analysis described above. With this arrangement, each heating element 150 is unlikely to be thermally resistive to the thermally conductive plate 133. That is, cooling by the thermally conductive plate 133 and heating by the heating element 150 are enabled in an efficient manner.

As described above, the showerhead 13 according to the present embodiment minimizes interference between the cooling path and the heating path that are associated with the top electrode plate 131.

<Action and Effect>

In the showerhead 13 of the plasma processing apparatus 1 according to the present embodiment, each heating element 150 is disposed at a location that does not overlap one or more coolant flow paths 133a, when viewed from above the showerhead. In contrast, in each of the showerhead 13x1 and showerhead 13x2 in the reference examples, the heating sheet 150x is provided on the entire surface being a given one surface of the thermally conductive plate 133.

A low heat transfer coefficient of each of the heating element 150 and the heating sheet 150x is obtained in comparison to aluminum that forms the gas diffusion plate 132 and the thermally conductive plate 133. Also, in the thermally conductive plate 133, a low heat transfer coefficient of a portion of the coolant flow path 133a is obtained, in comparison to aluminum that forms the thermally conductive plate 133.

The showerhead 13 according to the present embodiment is provided at a location at which each heating element 150 does not overlap one or more coolant flow paths 133a of the thermally conductive plate 133, when viewed from above the showerhead. With this arrangement, the heating element 150 and the coolant flow path 133a are each used to prevent interference for heat transfer and thus cooling and heating of the top electrode plate 131 can be effectively performed. That is, in the plasma processing apparatus 1, the temperature of the top electrode plate 131 can be efficiently adjusted by securing a heating path and a cooling path. With this arrangement, the plasma processing apparatus 1 according to the present embodiment efficiently cools and heats the top electrode plate 131, thereby enabling the temperature of the top electrode plate 131 to be adjusted faster.

<Modifications>

When one or more heating elements 150 are each disposed at a location that does not overlap one or more coolant flow paths 133a, in a view viewed from above the coolant flow paths, locations of the heating elements 150 are not limited to the example described above.

Figure 4:
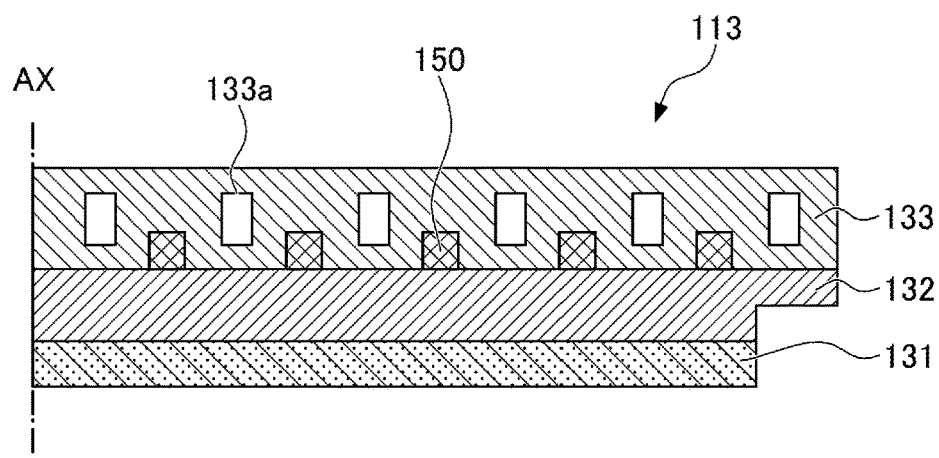
FIG. 4 is a cross-sectional view of an example of the showerhead of the plasma processing system according to a first modification of the present embodiment.

FIG. 4 is a cross-sectional view of an example of a showerhead 113 according to a first modification to the showerhead 13 in the present embodiment. In the showerhead 113, one or more heating elements 150 are each disposed within the thermally conductive plate 133 and may be in contact with the gas diffusion plate 132. Each heating element 150 is disposed lower than the coolant flow paths 133a.

Figure 5:
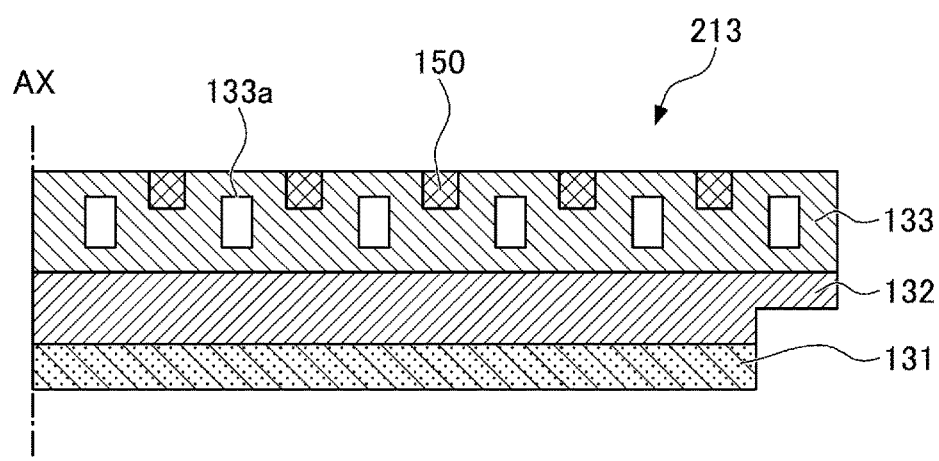
FIG. 5 is a cross-sectional view of an example of the showerhead of the plasma processing system according to a second modification of the present embodiment.

FIG. 5 is a cross-sectional view of an example of a showerhead 213 according to a second modification to the showerhead 13 in the present embodiment. In the showerhead 213, one or more heating elements 150 are each disposed higher than the coolant flow paths 133a, so as to be within the thermally conductive plate 133. In the example of each of FIGS. 4 and 5, at least one heating element 150 is disposed in the thermally conductive plate 133. In the example in FIG. 4, at least one heating element 150 is disposed lower than the coolant flow paths 133a. In the example in FIG. 5, at least one heating element 150 is disposed higher than the coolant flow paths 133a. At least one heating element 150 may be disposed at the same height as the coolant flow paths 133a.

Figure 6:
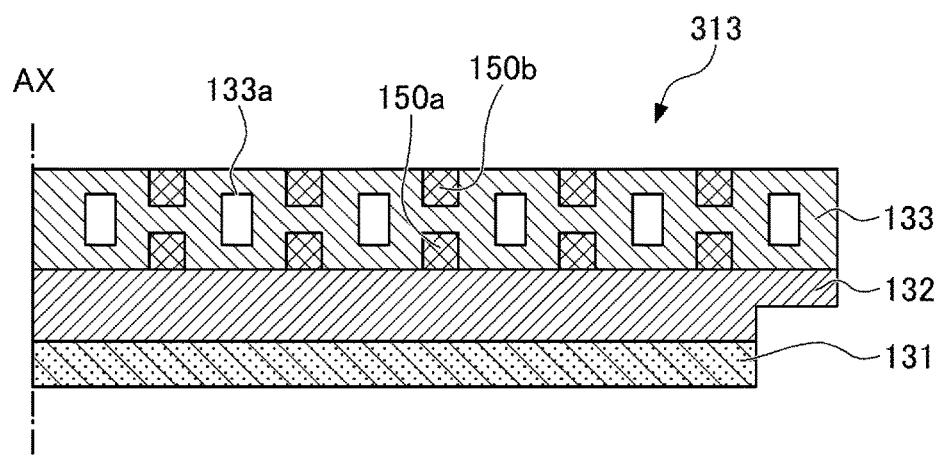
FIG. 6 is a cross-sectional view of an example of the showerhead of the plasma processing system according to a third modification of the present embodiment.

FIG. 6 is a cross-sectional view of an example of a showerhead 313 according to a third modification of the showerhead 13 in the present embodiment. In the showerhead 313, heating elements includes first heating elements 150a and second heating elements 150b that are disposed within the thermally conductive plate 133. Each first heating element 150a is disposed lower than the coolant flow paths 133a. Each second heating element 150b is disposed higher than the coolant flow paths 133a.

The top electrode plate 131 and the gas diffusion plate 132 are not limited to being separate from each other, as in the showerhead 13. For example, the top electrode plate 131 and the gas diffusion plate 132 may be formed together.

While certain embodiments have been described using the plasma processing apparatus, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

In the present disclosure, a plasma processing apparatus that can efficiently adjust a temperature of a top electrode is provided.

What is claimed is:

1. A plasma processing apparatus comprising:
    a chamber;
    a substrate support disposed in the chamber, the substrate support including a bottom electrode;
    a top electrode assembly disposed above the substrate support, the top electrode assembly including
        a top electrode plate disposed such that a plasma process space is formed between the top electrode plate and the substrate support,
        a thermally conductive plate disposed above the top electrode plate, the thermally conductive plate being thermally connected to the top electrode plate,
        a coolant flow path disposed within the thermally conductive plate, and
        at least one heating element thermally connected to the thermally conductive plate, the at least one heating element being disposed so as not to overlap with the coolant flow path in a plan view;
    a temperature sensor configured to detect a temperature of the top electrode plate; and
    a controller configured to control the at least one heating element and/or a coolant flowing through the coolant flow path, based on the temperature detected by the temperature sensor, to adjust the temperature of the top electrode plate,
    wherein the at least one heating element includes
        a first heating element disposed lower than the coolant flow path, and
        a second heating element disposed higher than the coolant flow path.

2. The plasma processing apparatus according to claim 1, wherein the controller is configured to control the at least one heating element and/or the coolant to maintain the temperature of the top electrode plate at a set temperature.

3. The plasma processing apparatus according to claim 1, wherein the top electrode assembly further includes a gas diffusion plate disposed between the top electrode plate and the thermally conductive plate, the gas diffusion plate having a gas diffusion space.

4. The plasma processing apparatus according to claim 3, wherein the gas diffusion plate is integrally formed with the thermally conductive plate.

5. The plasma processing apparatus according to claim 3, wherein the at least one heating element is disposed within the thermally conductive plate.

6. A plasma processing apparatus comprising:
a chamber;
a substrate support disposed in the chamber, the substrate support including a bottom electrode;
a top electrode assembly disposed above the substrate support, the top electrode assembly including
a top electrode plate disposed such that a plasma process space is formed between the top electrode plate and the substrate support,
a thermally conductive plate disposed above the top electrode plate, the thermally conductive plate being thermally connected to the top electrode plate,
a coolant flow path disposed within the thermally conductive plate, and
at least one heating element thermally connected to the thermally conductive plate, the at least one heating element being disposed so as not to overlap with the coolant flow path in a plan view; and
a radio frequency generator coupled to the top electrode plate or the bottom electrode, the radio frequency generator being configured to
generate a first RF power during a first period, and
generate a second RF power during a second period, the second RF power being less than the first RF power; and
a controller configured to control the at least one heating element and/or a coolant flowing through the coolant flow path to adjust a temperature of the top electrode plate, the controller configured to
cool the top electrode plate during the first period, by controlling the coolant and stopping control of the at least one heating element, and
heat the top electrode plate during the second period, by stopping the control of the coolant and controlling the at least one heating element,
wherein the controller is configured to
cause the radio frequency generator to generate a third RF power during a third period, the third RF power being less than the first RF power and greater than the second RF power, and
control both the coolant and the at least one heating element during the third period to maintain the temperature of the top electrode plate at a set temperature.

* * * * *